(12) United States Patent
Ekstein et al.

(10) Patent No.: US 8,976,927 B2
(45) Date of Patent: Mar. 10, 2015

(54) SUBSTRATE FOR MIRRORS FOR EUV LITHOGRAPHY

(71) Applicant: Carl Zeiss SMT GmbH, Oberkochen (DE)

(72) Inventors: Claudia Ekstein, Ellwangen (DE); Johannes Lippert, Buch am Wald (DE); Holger Maltor, Aalen (DE); Martin Weiser, Sinsheim (DE); Heiko Siekmann, Aalen (DE); Udo Dinger, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 13/781,073

(22) Filed: Feb. 28, 2013

(65) Prior Publication Data

US 2013/0170056 A1    Jul. 4, 2013

Related U.S. Application Data

(63) Continuation of application No. PCT/EP2011/064904, filed on Aug. 30, 2011.

(30) Foreign Application Priority Data

Aug. 30, 2010    (DE) .................. 10 2010 039 927

(51) Int. Cl.
*G21K 5/00*    (2006.01)
*G02B 5/08*    (2006.01)

(52) U.S. Cl.
CPC .................... *G02B 5/0891* (2013.01)
USPC ............................. 378/34; 359/838

(58) Field of Classification Search
USPC .......................... 378/34–35; 101/450.1–473; 430/302–305; 359/354–359, 726–732, 359/838; 355/53; 501/11
See application file for complete search history.

(56) References Cited

U.S. PATENT DOCUMENTS

| 5,269,683 | A  | * | 12/1993 | Hickok et al. ............... 433/30 |
| 6,377,655 | B1 |   | 4/2002  | Murakami et al. |
| 7,331,695 | B2 |   | 2/2008  | Ohmi et al. |
| 7,344,263 | B2 |   | 3/2008  | Ishizuka |
| 2003/0043483 | A1 | | 3/2003 | Folta et al. |

(Continued)

FOREIGN PATENT DOCUMENTS

| CN | 1427959 A | 7/2003 |
| CN | 1488994 A | 4/2004 |

(Continued)

OTHER PUBLICATIONS

Office Action in corresponding Chinese Application No. 201180041910.9, dated Sep. 1, 2014, along with an English translation.

*Primary Examiner* — Jennifer L. Doak
(74) *Attorney, Agent, or Firm* — Edell, Shapiro & Finnan, LLC

(57) ABSTRACT

Substrates suitable for mirrors which are used at wavelengths in the EUV wavelength range have a main body (2) and a polishing layer (3). The polishing layer (3) has a thickness of less than 10 µm and a root-mean-square roughness of less than 0.5 nm and the main body (2) is produced from an aluminum alloy. Moreover, a highly reflective layer (6) is provided on the polishing layer (3) of the substrate (1) of the EUV mirror (5).

20 Claims, 3 Drawing Sheets

(56) References Cited

U.S. PATENT DOCUMENTS

| | | |
|---|---|---|
| 2004/0012767 A1* | 1/2004 | Van Elp et al. ............... 355/72 |
| 2004/0063004 A1 | 4/2004 | Alkemper et al. |
| 2004/0165296 A1 | 8/2004 | Schaefer |
| 2004/0174624 A1 | 9/2004 | Weiser et al. |
| 2004/0233530 A1 | 11/2004 | Kramer et al. |
| 2007/0217015 A1 | 9/2007 | Furuya et al. |
| 2010/0027106 A1 | 2/2010 | Weiser et al. |
| 2010/0053785 A1 | 3/2010 | Nishi et al. |
| 2013/0057952 A1 | 3/2013 | Risse et al. |

FOREIGN PATENT DOCUMENTS

| | | |
|---|---|---|
| CN | 101004456 A | 7/2007 |
| CN | 101680975 A | 3/2010 |
| DE | 10 2005 026 418 A1 | 12/2006 |
| DE | 10 2009 040 785 A1 | 3/2011 |
| EP | 1387189 A2 | 2/2004 |
| TW | 200428022A A | 12/2004 |
| TW | 200500650 A | 1/2005 |
| WO | 2011/029603 A1 | 3/2011 |

* cited by examiner

US 8,976,927 B2

SUBSTRATE FOR MIRRORS FOR EUV LITHOGRAPHY

This application is a Continuation of International Application No. PCT/EP2011/064904, with an international filing date of Aug. 30, 2011, which was published under PCT Article 21(2) in German, and which claims priority to German patent Application No. 10 2010 039 927.2 filed on Aug. 30, 2010. The entire disclosures of these parent patent applications are incorporated into the present Continuation by reference.

FIELD OF AND BACKGROUND OF THE INVENTION

The present invention relates to a substrate for a mirror for EUV lithography comprising a main body and a polishing layer, and to a mirror for an EUV projection exposure apparatus, comprising such a substrate and a highly reflective layer on the polishing layer.

In order to be able to produce ever finer structures during the production of, for example, semiconductor components by lithographic methods, light having ever shorter wavelengths is employed. If light in the extreme ultraviolet (EUV) wavelength range is employed, for instance at wavelengths of between approximately 5 nm and 20 nm, it is no longer possible to employ lens-like elements in transmission, rather illumination and projection lenses are constructed from mirror elements having highly reflective coatings adapted to the respective operating wavelength. In contrast to mirrors in the visible and ultraviolet wavelength ranges, even theoretically only maximum reflectivities of less than 80% can be achieved per mirror. Since EUV projective devices generally have a plurality of mirrors, it is necessary for each of these to have the highest possible reflectivity in order to ensure a sufficiently high total reflectivity.

OBJECTS AND SUMMARY OF THE INVENTION

It is an object of the present invention to propose mirror substrates which are suitable as substrates for mirrors which are used at wavelengths in the EUV wavelength range.

This object is achieved with a substrate for a mirror for EUV lithography comprising a main body and a polishing layer, wherein the polishing layer has a thickness of less than 10 μm and a root-mean-square roughness of less than 0.5 nm, and the main body is produced from an aluminum alloy.

The root-mean-square roughness, also called RMS roughness, is calculated from the mean of the squares of the deviation of the measurement points over the surface with respect to an average area which is placed through the surface such that the sum of the deviations relative to the average area is minimal. In particular for optical elements for EUV lithography, the roughness in a spatial frequency range of 0.1 μm to 200 μm is of particular importance in order to avoid adverse influences on the optical properties of the optical elements.

In particular in the EUV wavelength range, the proportion of stray light in the optical systems, such as, for instance, illumination system and in particular projection system, of projection exposure apparatuses for lithographic methods has a significant influence on the performance of the respective projection exposure apparatus. The proportion of stray light can be influenced by the roughness of the optical elements. By providing a substrate for further processing to form a mirror, which substrate comprises a main body and a polishing layer having a maximum thickness of approximately 10 μm with a root-mean-square roughness of a maximum of approximately 0.5 nm, preferably 0.3 nm, particularly preferably 0.2 nm, it is possible for the resulting mirror also to be used in EUV lithography. This is because, due to these features of the substrate, the proportion of stray light which arises at the mirror can be kept within a scope that does not have a disturbing effect on the lithographic process, and the reflectivity of the mirror can thus also be increased. In this case, the proposed substrate is suitable, in particular, for EUV mirrors which comprise a highly reflective coating which are based on a multilayer system composed of alternate layers of material having different real parts of the complex refractive index, through which a crystal having lattice planes at which Bragg diffraction takes place for use with normal incidence is in a way simulated. Alternatively, it is also possible to provide only one or a few metallic layers for use with grazing incidence of the EUV radiation. Highly reflective coatings is the term used at wavelengths in the EUV range if reflectivities of 60% or more are achieved. The reflectivity that can actually be achieved can be additionally increased with the aid of the substrate proposed here.

The proposed substrate has the advantage that, firstly, for the main body it is possible to choose a material that is suitable for use as an EUV mirror for example with regard to its strength. Secondly, the surface of the substrate can be optimized by the choice of a further material that can be polished well. The polishing layer substantially only influences the properties of the substrate surface, while the mechanical properties are determined by the main body.

Aluminum alloys have the advantage that they have high strengths at low density, in particular under even relatively high thermal load such as can occur in projection exposure apparatuses for EUV lithography. Also, they are readily commercially available, such that substrates comprising a main body composed of an aluminum alloy can also be economically expedient. In preferred embodiments, the main body is produced from an aluminum alloy having a higher strength and/or a higher hardness than aluminum. Such aluminum alloys, in particular, have the advantage of a long lifetime and high corrosion resistance, in particular in comparison with aluminum as main body material.

Preferably, the main body is produced from a material from the group aluminum-magnesium alloy, aluminum-magnesium-silicon alloy, aluminum-zinc alloy, aluminum-silicon-metal1-metal2 alloy, aluminum-copper alloy and aluminum-silicon. Other aluminum alloys comprising other further metals, for example manganese, lithium and/or iron, can also be suitable as material for the main body of the substrate. In particular, a plurality of alloys can also be combined with one another.

Preferably, the base layer is produced from a dispersion strengthened aluminum alloy. Such aluminum alloys are distinguished by a particularly high strength. Preferably, aluminum oxide or silicon oxide, for example, is used as dispersant. Advantageously, in particular the dispersion strengthened aluminum alloys can be produced by powder metallurgy. Furthermore, the main body can also be composed of an aluminum alloy produced through spray compaction, in particular in the case of aluminum alloys having a high silicon content. It is also possible to produce the main body from quasi-crystalline aluminum alloys.

In one preferred embodiment, the polishing layer is produced from a material of the group nickel-phosphorus composition, nickel-boron composition, copper. In a further preferred embodiment, the polishing layer is produced from a material of the group silicon dioxide, amorphous silicon, crystalline silicon. The materials of the first group are already used in metal processing, and the materials of the second group are already used in semiconductor production, inter alia, where surfaces polished to achieve particularly low roughnesses are required. In particular, these materials can be polished to root-mean-square roughnesses of 0.5 nm, preferably 0.3 nm, particularly preferably 0.2 nm or less, in a spatial frequency range of 0.1 µm to 200 µm.

Advantageously, an adhesion promoter layer is arranged between the main body and the polishing layer. In particular in the case of silicon-based polishing layers on an aluminum-based main body, it is thereby possible to improve the adhesion of the polishing layer on the main body.

In a further aspect, said object is achieved with a mirror for an EUV projection exposure apparatus, said mirror comprising a substrate as described above and a highly reflective layer on the polishing layer.

The above and further features are evident not only from the claims but also from the description and the drawings, wherein the individual features can in each case be realized by themselves or as a plurality in the form of sub-combinations in an embodiment of the invention and in other fields and can constitute advantageous and distinctly protectable embodiments.

BRIEF DESCRIPTION OF THE DRAWINGS

The present invention will be explained in greater detail with reference to a preferred exemplary embodiment. In this respect.

DETAILED DESCRIPTION

Figure 1A:
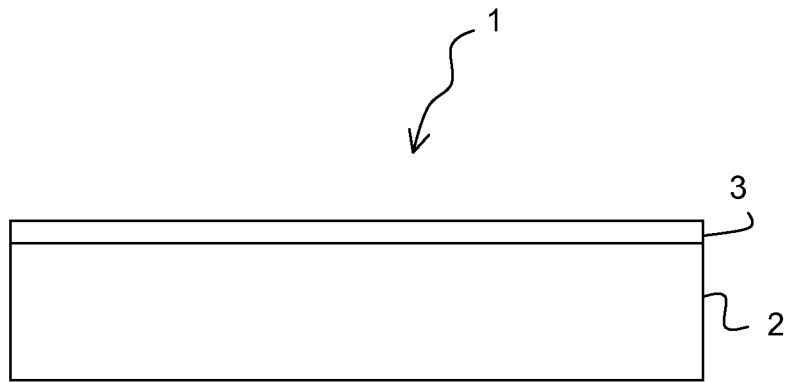
FIGS. 1 a, b schematically show two variants of a substrate in section.

FIG. 1a schematically illustrates a first variant of an embodiment of a substrate 1 comprising a main body 2 and a polishing layer 3 applied thereto. The main body 2 and the polishing layer 3 perform different functions. While a good dimensional stability is of primary significance for the main body 2, good processability and polishability are primarily of importance in the case of the polishing layer 3.

The polishing layer can be applied using customary vacuum coating methods such as, for example, sputtering methods, electron beam evaporation, molecular beam epitaxy or ion beam assisted coating. If the polishing layer is a metallic material, for example copper, nickel-phosphorus or nickel-boron, it is preferably applied in an externally electroless way. In particular nickel-phosphorus or nickel-boron polishing layers can also be applied as dispersion layers, wherein polytetrafluoroethylene, for example, can serve as dispersant.

In particular nickel-phosphorus or nickel-boron polishing layers are preferably applied with relatively high concentrations of phosphorus or boron, such that they are present predominantly or even completely in an amorphous fashion and can be polished better as a result. They can subsequently be hardened by heat treatment, plasma treatment or ion bombardment, for example. Silicon as polishing layer material can also be deposited in an amorphous or crystalline fashion in a controlled manner using the coating method. In this case, amorphous silicon can be polished better than crystalline silicon and can as necessary likewise be hardened by heat treatment, plasma treatment or ion bombardment. Polishing layers composed of silicon or silicon dioxide can also be smoothed using ion beams.

Preferred thicknesses of the polishing layer 3 are, e.g. approximately 5 µm to 10 µm for polishing layers based on nickel or copper, for example. In the case of polishing layers 3 composed of silicon, in particular amorphous silicon, or silicon dioxide, preferred layer thicknesses are, for example, approximately 1.5 µm to 3 µm. Using customary polishing methods, polishing layers based on nickel or copper, in particular nickel-phosphorus alloys, can be polished to root-mean-square roughnesses of less than 0.3 nm in the spatial frequency range of 1 µm to 200 µm and to root-mean-square roughnesses of less than 0.25 nm in the spatial frequency range of 0.01 µm to 1 µm. Polishing layers composed of silicon dioxide can be polished to root-mean-square roughnesses of less than 0.2 nm over the entire spatial frequency range of 0.01 µm to 200 µm using customary polishing methods, while in the case of silicon, in particular amorphous silicon, root-mean-square roughnesses of less than 0.3 nm can be achieved in the spatial frequency range of 0.01 µm to 200 µm using customary polishing methods.

Figure 1B:
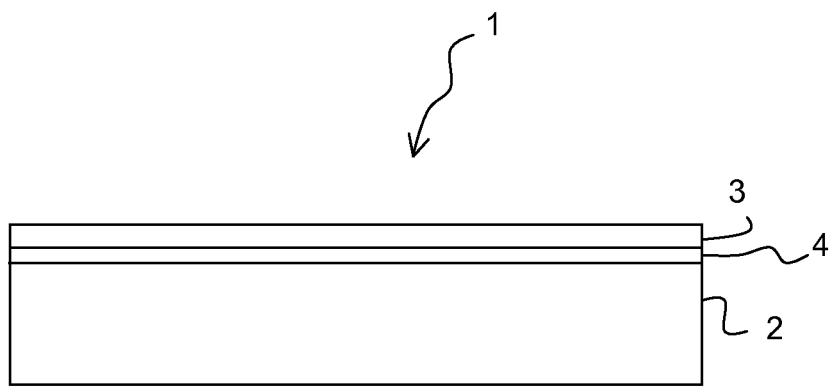

FIG. 1b schematically illustrates a variant of the substrate 1 from FIG. 1a, in which an adhesion promoter layer 4 is arranged between the main body 2 and the polishing layer 3. Preferably, the adhesion promoter layer 4 can have a thickness of up to 2 mm, and a root-mean-square roughness of up to 1 nm in the spatial frequency range of 0.01 µm to 200 µm.

In a first exemplary embodiment, the main body 2 of the substrate 1 consists of the aluminum-magnesium wrought alloy EN AW-5019 (according to DIN EN 573.1 and 3), a naturally hard aluminum alloy. A nickel-phosphorus layer as polishing layer was deposited thereon in an electroless fashion. It has a thickness of 5 µm and was polished to a root-mean-square roughness of less than 0.3 nm using customary polishing methods.

In a second exemplary embodiment, the main body 2 of the substrate 1 consists of the aluminum-magnesium-silicon wrought alloy EN AW-6082 (according to DIN EN 573.1 and 3), a readily hardenable aluminum alloy. A nickel-boron layer as polishing layer was deposited thereon in an electroless fashion. It has a thickness of 6 µm and was polished to a root-mean-square roughness of less than 0.3 nm using customary polishing methods.

In a third exemplary embodiment, the main body 2 of the substrate 1 consists of the aluminum-copper wrought alloy EN AW-2024 (according to DIN EN 573.1 and 3), a readily hardenable aluminum alloy. A copper layer as polishing layer was deposited thereon in an electroless fashion. It has a thickness of 7 µm and was polished to a root-mean-square roughness of less than 0.3 nm using customary polishing methods.

In a fourth exemplary embodiment, the main body 2 of the substrate 1 consists of a dispersion hardened aluminum alloy comprising approximately 2% by volume of aluminum oxide as dispersant, which alloy was produced by powder metallurgy. A nickel-boron layer as polishing layer was deposited thereon in an electroless fashion. It has a thickness of 8 µm and was polished to a root-mean-square roughness of less than 0.3 nm using customary polishing methods.

In a fifth exemplary embodiment, the main body 2 of the substrate 1 consists of an aluminum-silicon alloy comprising approximately 45% by volume of silicon, which alloy was produced using spray compaction. An amorphous silicon layer as polishing layer was deposited thereon using customary vacuum coating methods. It has a thickness of 1.5 µm and was polished to a root-mean-square roughness of less than 0.3 nm using customary polishing methods.

In a sixth exemplary embodiment, the main body 2 of the substrate 2 consists of the aluminum-magnesium wrought alloy EN AW-5019 (according to DIN EN 573.1 and 3), a naturally hard aluminum alloy. A silicon dioxide layer as polishing layer was deposited thereon using customary vacuum coating methods. It has a thickness of 2 µm and was polished to a root-mean-square roughness of less than 0.2 nm using customary polishing methods.

In a seventh exemplary embodiment, the main body 2 of the substrate 1 consists of the aluminum-magnesium-silicon wrought alloy EN AW-6082 (according to DIN EN 573.1 and 3), a readily hardenable aluminum alloy. An amorphous silicon layer as polishing layer was deposited thereon using customary vacuum coating methods. It has a thickness of 3 µm and was polished to a root-mean-square roughness of less than 0.3 nm using customary polishing methods.

In an eighth exemplary embodiment, the main body 2 of the substrate 1 consists of the aluminum-zinc wrought alloy EN AW-7075 (according to DIN EN 573.1 and 3), a high-strength aluminum alloy. A crystalline silicon layer as polishing layer was deposited thereon using customary vacuum coating methods. It has a thickness of 2.5 µm and was polished to a root-mean-square roughness of less than 0.3 nm using customary polishing methods.

In further modifications of these exemplary embodiments, the aluminum alloys mentioned can also be replaced by silicon-containing aluminum alloys comprising further metals, for example by AlSi35Fe2Ni, AlSi30MgCu, AlSi17Fe5Cu4Mg, AlSi20Fe5Ni2 or the like.

Such substrates 1 can be processed further to form EUV mirrors 5, as is schematically illustrated in a first variant of an embodiment in FIG. 2 by a highly reflective layer 6 being applied to the polishing layer 3. Particularly preferably for use in the case of EUV radiation in the wavelength range of approximately 5 nm to 20 nm, the highly reflective layer 6 is a multilayer system composed of alternate layers of material having different real parts of the complex refractive index, through which in a way a crystal having lattice planes at which Bragg diffraction takes place is simulated. For use at 13 nm to 14 nm, for example, a multilayer system composed of alternate silicon and molybdenum layers can be applied.

Figure 2A:
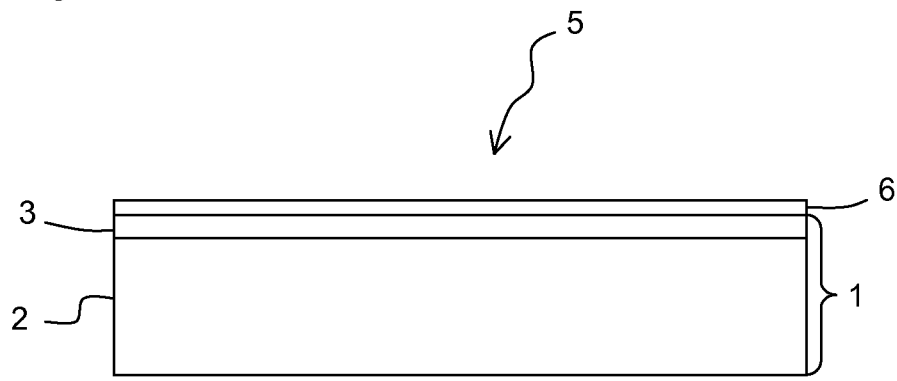
FIGS. 2a, b schematically show two variants of a mirror in section.
Figure 2B:
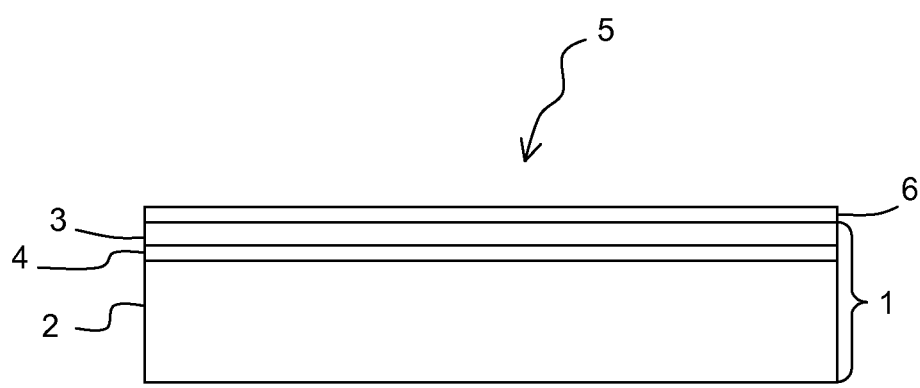

FIG. 2b schematically illustrates a further variant of the mirror 5 from FIG. 2a, in which an adhesion promoter layer 4 is arranged between the main body 2 and the polishing layer 3 of the substrate 1 of the mirror 5.

The mirror 5 on the basis of the substrates 1 described above can be used both in illumination and in projection systems of EUV projection exposure apparatus. Owing to the high strength, in particular tensile strength, or the high hardness of the main bodies 2, the substrates 1 are suitable inter alia, for example, for mirrors having small parts, which can be individually actuable, if appropriate, which are intended to have a good dimensional stability, in particular in case of heat. It is also possible here for a plurality of mirrors having small parts to interact as a larger unit, such as, for example, so-called facet mirrors in illumination systems of EUV projection exposure apparatuses.

In particular if the highly reflective layer 6 is configured as a multilayer system, it is preferably applied by customary vacuum coating methods such as, for example, sputtering methods, electron beam evaporation, molecular beam epitaxy or ion beam assisted coating. The stray light proportion of the EUV mirrors 5 which were produced on the basis of the abovementioned substrates 1 was able to be reduced by several percent compared with mirrors comprising conventional substrates. This also resulted in an increase in reflectivity by a few percent. By using a plurality of the mirrors 5 proposed here in a projection exposure apparatus for EUV lithography, this positive effect can increase.

Figure 3A:
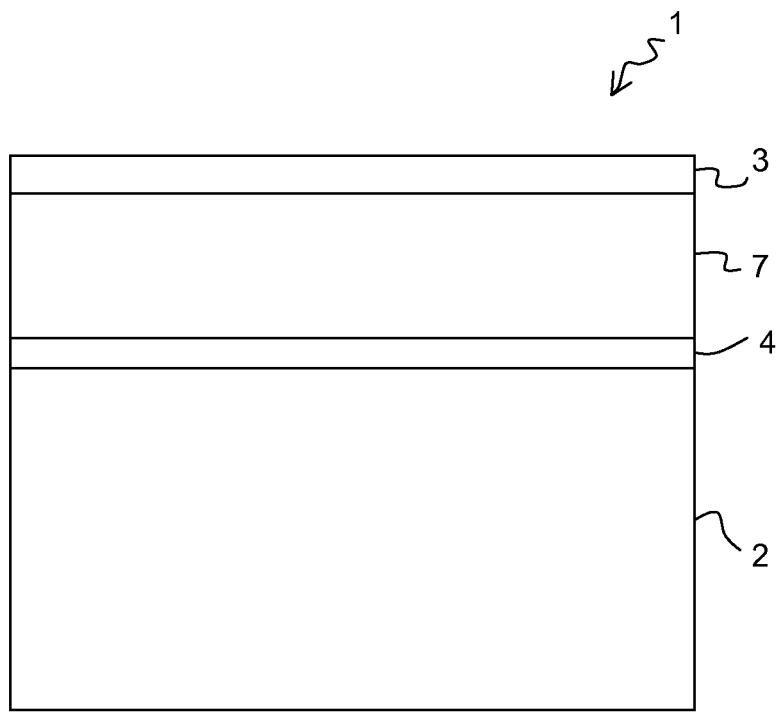
FIGS. 3a, b schematically show two further variants of a mirror in section.
Figure 3B:
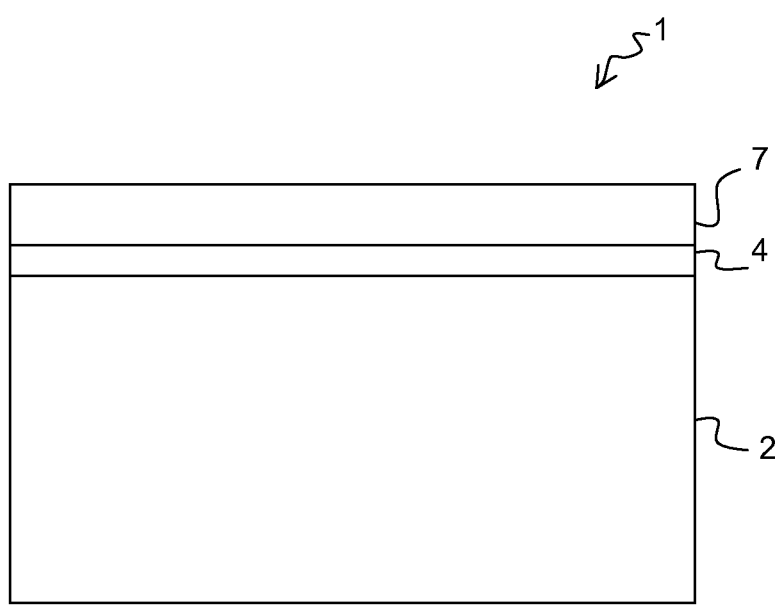

FIGS. 3a and 3b illustrate substrates 1 which are suitable in particular for use as mirrors 5 with grazing incidence of radiation in the wavelength range of between 5 nm and 20 nm. The main body 2 of the substrate 1 illustrated in FIG. 3a can be composed not only of the materials already mentioned, but also of aluminum with up to 0.3% by weight of silicon, of aluminum with up to 0.6% by weight of silicon, of polycrystalline silicon or else of a composite material composed of silicon and silicon carbide, which can be produced by sintering, for example.

The substrate 1 illustrated in FIG. 3a is distinguished, in particular, by the structured layer 7 arranged on the main body 2, wherein an adhesion promoter layer 4 is arranged between the structured layer and the main body 2. The structured layer 7 is preferably composed of a metal structured by forming technology, for example electrolytically or by embossing. The forming technology is preferably performed such that it is possible to implement a diffraction grating in the structured layer 7 which diffracts radiation at wavelengths outside the EUV wavelength range, in order to remove the radiation with these wavelengths—if present—as far as possible from the beam path. By way of example, nickel-phosphorus layers or copper layers have proved to be particularly worthwhile in this case. In particular if the structured layer 7 is composed of nickel-phosphorus and the main body 2 is composed of aluminum with up to 0.3% by weight of silicon, zinc has proved to be a suitable material for the adhesion promoter layer 4. If copper is used in the structured layer 7, nickel is preferably used as material for the adhesion promoter layer 4.

A polishing layer 3 is arranged above the structured layer 7, said polishing layer preferably being composed of amorphous silicon or silicon dioxide in the example illustrated here. Said polishing layer 3 firstly protects the diffraction structure in the structured layer 7 and secondly, with a root-mean-square roughness of less than 0.5 nm, offers a sufficiently smooth support for applying, for example, one or a plurality of metal layers for the use of the resultant mirror as a mirror for grazing incidence of EUV radiation or alternatively for applying multilayer systems for use as a mirror with normal incidence of EUV radiation.

Particularly preferably, the resultant mirror for grazing incidence is used as a collector mirror of an EUV projection exposure apparatus. In this case, the material choice of aluminum with a small proportion of silicon or polycrystalline silicon or a silicon/silicon carbide composite material as material for the main body has the advantage that even large mirror elements can be made available cost-effectively, which can be cooled well and can be structured to the effect that cooling channels can be provided in the respective main bodies. In the case where the substrate 1 illustrated in FIG. 3a is used in collector mirrors of EUV projection exposure apparatuses, additional advantages are afforded in the case of radiation sources such as, for instance, laser plasma radiation sources which are excited, inter alia, with the aid of carbon dioxide lasers. The introduction of diffraction structures for the infrared wavelength range is possible particularly simply and allows the infrared radiation to be filtered out of the radiation spectrum provided by the radiation source as early as at the beginning of the beam path.

In the case of the example illustrated in FIG. 3a, it is possible to provide, for example, adhesion promoter layers 4 having a thickness of less than 10 nm, preferably less than 5 nm, structured layers 7 having a thickness of, for example, approximately 10 µm to a few thousand µm, preferably approximately 50 µm to a few hundred µm, and polishing layers composed of amorphous silicon or silicon dioxide having a thickness of, for example, approximately 1 µm to 10 µm, preferably approximately 3 µm to 5 µm.

In a modification of the example illustrated in FIG. 3a, for use as a substrate for collector mirrors with grazing incidence in EUV projection exposure apparatuses, FIG. 3b illustrates a substrate 1 which does not comprise a structured layer 7, but rather in which the polishing layer 3 composed of nickel-phosphorus alloy is provided on a main body 2 composed of one of the materials just mentioned. For better adhesion of the polishing layer 3 composed of nickel-phosphorus on the main body 2 composed of, for example, in particular aluminum with a small proportion of silicon, alternatively composed of a silicon/silicon carbide composite material or composed of polycrystalline silicon, an adhesion promoter layer 4 composed of zinc is provided. In a further modification, the polishing layer 3 can also be composed of copper with an adhesion promoter layer 4 composed of nickel.

The above description of various embodiments has been given by way of example. From the disclosure given, those skilled in the art will not only understand the present invention and its attendant advantages, but will also find apparent various changes and modifications to the structures disclosed. It is sought, therefore, to cover all such changes and modifications as fall within the spirit and scope of the invention, as defined by the appended claims, and equivalents thereof.

The invention claimed is:

1. An apparatus comprising
a substrate for a mirror configured to reflect extreme ultraviolet (EUV) radiation, the substrate comprising:
a main body produced from an aluminum alloy,
a polishing layer having a thickness of less than 10 µm and a root-mean-square roughness of less than 0.5 nm; and
a reflective layer arranged on the polishing layer of the substrate, the reflecting layer comprising a multilayer structure configured to reflect EUV radiation.

2. The apparatus as claimed in claim 1, wherein the main body is produced from a material selected from the group consisting of: aluminum-magnesium alloy, aluminum-magnesium-silicon alloy, aluminum-zinc alloy, aluminum-silicon-metal1-metal2 alloy, aluminum-copper alloy, and aluminum-silicon.

3. The apparatus as claimed in claim 1, wherein the main body is produced from a dispersion strengthened aluminum alloy.

4. The apparatus as claimed in claim 1, wherein the main body is produced from an aluminum alloy produced by powder metallurgy.

5. The apparatus as claimed in claim 1, wherein the polishing layer is produced from a material selected from the group consisting of: nickel-phosphorus composition, nickel-boron composition, and copper.

6. The apparatus as claimed in claim 1, wherein the polishing layer is produced from a material selected from the group consisting of: silicon dioxide, amorphous silicon, and crystalline silicon.

7. The apparatus as claimed in claim 1, wherein the polishing layer has a root-mean-square roughness of less than 0.3 nm.

8. The apparatus as claimed in claim 1, wherein the polishing layer has a root-mean-square roughness of less than 0.2 nm.

9. The apparatus as claimed in claim 1, the substrate further comprises an adhesion promoter layer arranged between the main body and the polishing layer.

10. The apparatus as claimed in claim 9, wherein the adhesion promoter layer has a thickness of less than 2 mm and a root-mean-square roughness of less than 1 nm in the spatial frequency range of 0.01 µm to 200 µm.

11. A mirror for an EUV projection exposure apparatus, comprising the apparatus of claim 1.

12. The apparatus as claimed in claim 3, wherein the dispersion strengthened aluminum alloy comprises 2% by volume of aluminum oxide as a dispersant.

13. A substrate for a mirror for extreme ultraviolet (EUV) lithography comprising:
a main body produced from an aluminum alloy,
a polishing layer having a thickness of less than 10 µm and a root-mean-square roughness of less than 0.5 nm, and
a structured layer composed of metal and structured to diffract radiation other than EUV radiation.

14. The substrate as claimed in claim 13, wherein the structured layer is arranged between the main body and the polishing layer.

15. The substrate as claimed in claim 14, further comprising an adhesion promoter layer arranged between the main body and the polishing layer.

16. The substrate as claimed in claim 15, wherein the adhesion promoter layer has a thickness of less than 10 nm, the structured layer has a thickness of less than 1 mm, and the polishing layer has a thickness of less than 10 µm.

17. The substrate as claimed in claim 14, wherein the structured layer is produced from a material selected from the group consisting of: nickel-phosphorus and copper.

18. An apparatus comprising
a substrate for a mirror configured to reflect extreme ultraviolet (EUV) radiation, the substrate comprising:
a main body produced from an aluminum alloy,
a polishing layer having a thickness of less than 10 µm and a root-mean-square roughness of less than 0.5 nm;
a reflective layer arranged on the polishing layer of the substrate, wherein the reflecting layer comprises one or a plurality of metal layers.

19. The apparatus as claimed in claim 18, wherein the main body is produced from a material selected from the group consisting of: aluminum-magnesium alloy, aluminum-magnesium-silicon alloy, aluminum-zinc alloy, aluminum-silicon-metal1-metal2 alloy, aluminum-copper alloy, and aluminum-silicon.

20. The apparatus as claimed in claim 18, wherein the main body is produced from a dispersion strengthened aluminum alloy.

* * * * *